United States Patent
Keating et al.

(10) Patent No.: US 11,233,012 B2
(45) Date of Patent: Jan. 25, 2022

(54) FABRIC-BASED ITEMS HAVING STRANDS WITH EMBEDDED COMPONENTS

(71) Applicant: Apple Inc., Cupertino, CA (US)

(72) Inventors: Steven J. Keating, Sunnyvale, CA (US); Daniel D. Sunshine, Sunnyvale, CA (US); Benjamin J. Grena, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 238 days.

(21) Appl. No.: 16/134,839

(22) Filed: Sep. 18, 2018

(65) Prior Publication Data
US 2019/0287910 A1    Sep. 19, 2019

Related U.S. Application Data

(60) Provisional application No. 62/645,079, filed on Mar. 19, 2018.

(51) Int. Cl.
*H01L 23/538*   (2006.01)
*D02G 3/12*   (2006.01)
(Continued)

(52) U.S. Cl.
CPC ........... *H01L 23/5387* (2013.01); *D02G 3/12* (2013.01); *D02G 3/36* (2013.01); *D02G 3/441* (2013.01);
(Continued)

(58) Field of Classification Search
CPC .. D02G 3/12; D02G 3/34; D02G 3/36; D02G 3/44; D02G 3/441; D03D 1/0088;
(Continued)

(56) References Cited

U.S. PATENT DOCUMENTS 2,298,676 A    10/1942 Camp
3,969,816 A    7/1976 Swengel, Sr. et al.
(Continued)

FOREIGN PATENT DOCUMENTS

CN    1543424 A    11/2004
CN    1650057 A    8/2005
(Continued)

*Primary Examiner* — Marla D McConnell
*Assistant Examiner* — Larissa Rowe Emrich
(74) *Attorney, Agent, or Firm* — Treyz Law Group, P.C.; G. Victor Treyz; David K. Cole (57) ABSTRACT

A fabric-based item may include fabric formed from intertwined strands of material with embedded circuitry. The strands of material may be formed from dielectric materials such as polymers. The strands of material may be formed from joined segments of polymer strand material or other material. Each joined segment may contain a potentially distinct circuit. Some joined segments may include one or more conductive lines. The conductive lines may run parallel to each other along the length of the joined segments to form circuit interconnects. Conductive lines may be joined to contact pads on integrated circuits and other embedded components formed from semiconductor dies. Control circuitry formed from the integrated circuits embedded in strands of material in the fabric and other control circuitry may be used to control the circuitry embedded in the fabric.

19 Claims, 10 Drawing Sheets

(51) Int. Cl.
*D02G 3/36* (2006.01)
*D02G 3/44* (2006.01)
*H01L 33/62* (2010.01)
*H01L 25/065* (2006.01)
*H01L 25/18* (2006.01)
*H01L 25/16* (2006.01)
*H01L 25/075* (2006.01)
*D03D 1/00* (2006.01)
*D03D 15/47* (2021.01)

(52) U.S. Cl.
CPC ........... *D03D 1/0088* (2013.01); *D03D 15/47* (2021.01); *H01L 23/5386* (2013.01); *H01L 23/5389* (2013.01); *H01L 25/0655* (2013.01); *H01L 25/0753* (2013.01); *H01L 25/167* (2013.01); *H01L 25/18* (2013.01); *H01L 33/62* (2013.01); *D10B 2101/20* (2013.01); *D10B 2401/16* (2013.01); *D10B 2401/18* (2013.01)

(58) Field of Classification Search
CPC ........ D03D 15/37; D03D 15/00; D03D 15/44; D01F 1/09; D10B 2401/16; D10B 2401/18; H01L 23/538; H01L 23/5386; H01L 23/5387; H01L 23/5389; H01L 25/0655; H01L 25/0753; H01L 25/167; H01L 25/18; H01L 33/52–56; H01L 33/62; H01L 27/15
USPC .................. 136/255; 257/621–622, 787–796
See application file for complete search history.

(56) References Cited

U.S. PATENT DOCUMENTS

| | | | |
|---|---|---|---|
| 6,210,771 | B1 | 4/2001 | Post et al. |
| 2003/0211797 | A1* | 11/2003 | Hill .................. H05K 1/189 |
| | | | 442/205 |
| 2004/0009729 | A1 | 1/2004 | Hill et al. |
| 2007/0020445 | A1 | 1/2007 | Liu et al. |
| 2009/0018428 | A1 | 1/2009 | Dias et al. |
| 2014/0268604 | A1 | 9/2014 | Wicket et al. |
| 2017/0275789 | A1* | 9/2017 | Dias ..................... D02G 3/441 |
| 2018/0038022 | A1* | 2/2018 | Podhajny ............ D03D 15/00 |

FOREIGN PATENT DOCUMENTS

| | | | |
|---|---|---|---|
| CN | 101308596 A | 11/2008 | |
| CN | 205790457 U | 12/2016 | |
| CN | 205893784 U | 1/2017 | |
| CN | 106715769 A | 5/2017 | |
| CN | 107257869 A | 10/2017 | |
| JP | 2003202464 A | 7/2003 | |
| JP | 2004526068 A | 8/2004 | |
| JP | 2005524783 A | 8/2005 | |
| WO | 02084617 A1 | 10/2002 | |
| WO | 02095839 A2 | 11/2002 | |
| WO | 2016038342 A1 | 3/2016 | |
| WO | 2017175001 A1 | 10/2017 | |
| WO | WO-2017175001 A1 * | 10/2017 | ............ D02G 3/441 |

\* cited by examiner

FABRIC-BASED ITEMS HAVING STRANDS WITH EMBEDDED COMPONENTS

This application claims the benefit of provisional patent application No. 62/645,079, filed Mar. 19, 2018, which is hereby incorporated by reference herein in its entirety.

FIELD

This relates generally to fabric-based items and, more particularly, to fabric-based items having strands of material with embedded components.

BACKGROUND

It may be desirable to form bags, furniture, clothing, wearable electronic devices, and other items using fabric. In some arrangements, it may be desirable to incorporate electrical circuitry into fabric. If care is not taken, however, fabric-based items may not offer desired features. For example, fabric-based items may not include desired circuitry for providing a user with output or gathering input or may include circuitry that is bulky, heavy, and unattractive.

SUMMARY

A fabric-based item may include fabric formed from intertwined strands of material with embedded circuitry. The fabric-based item may include woven fabric, knit fabric, or other fabric. The circuitry in the fabric-based item may gather input from a user and from the user's surroundings. The circuitry may supply visual output, audio output, tactile output, and/or other output.

The strands of material may be formed from dielectric materials such as polymers. The strands of material may be formed from joined segments of polymer strand material or other material. Each joined segment may contain a potentially distinct circuit embedded within the polymer strand material. Computer-controlled assembly equipment may select and join customized collections of strand segments to form a strand or set of strands in the fabric to implement desired circuit functions.

Strand segments may include thermoplastic material and may be thermally joined or joined using other joining techniques. Some joined strand segments may include one or more conductive lines. The conductive lines may run parallel to each other along the length of the joined segments to form circuit interconnects. Conductive lines may be bonded to contact pads on integrated circuits and other embedded components formed from semiconductor dies. The semiconductor dies may have surface normals that extend parallel to the strands. Control circuitry formed from the integrated circuits embedded in strands of material in the fabric or other control circuitry may be used to control input-output components and other electrical components embedded in the fabric.

DETAILED DESCRIPTION

Items may incorporate strands of material. The strands of material can be incorporated into wearable items and other items. In some arrangements, fabric formed from strands of material may be used in forming clothing, straps, bags, enclosures, electronic device housing structures, and other fabric-based items. Circuitry can be incorporated into the items by embedding conductive lines, electrical components, and other circuits into strands of material. Segments of the strands can be joined in desired patterns to form more complex circuits. The circuitry embedded in the strands can be used to gather sensor input (e.g., touch input, force input, etc.) and/or can be used to supply output (e.g., light, sound, haptic output, electrical output, acoustic output, etc.).

Figure 1:
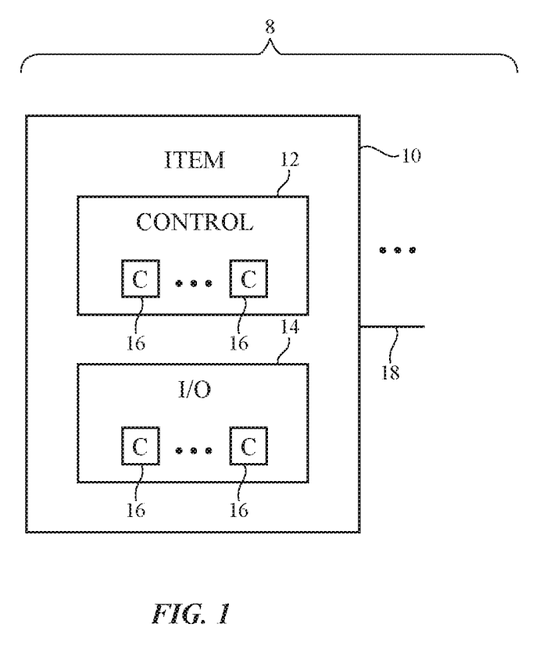
FIG. 1 is a schematic diagram of an illustrative system with one or more items in accordance with an embodiment.

FIG. 1 is a schematic diagram of a system with one or more illustrative items 10. As shown in FIG. 1, system 8 has at least one item 10. If desired, item 10 may interact with other items 10 via wired and/or wireless paths such as path 18. For example, a first item 10 may be a strap for a wristwatch and a second item 10 may be a metal watch unit that is coupled to the strap.

Each item 10 may include control circuitry 12. Control circuitry 12 may be formed from circuitry such as electrical components 16 (e.g., one or more integrated circuits such as microprocessors, microcontrollers, application-specific integrated circuits, digital signal processors, etc.). Control circuitry 12 may be used to control the operation of item 10 by controlling electrically controllable (electrically adjustable) components in item 10 and may be used to support communications with other items 10 (e.g., via paths such as path 18).

Item 10 may include input-output circuitry such as input-output devices 14. Devices 14 (and circuitry 12) may include one or more electrical components 16 (e.g., integrated circuits, semiconductor die, discrete components such as resistors, inductors, and capacitors, etc.). Input-output devices 14 may include components for providing a user of item 10 with output (e.g., light-emitting diodes, lasers, and other light-producing components for emitting light as part of a pixel array of other output device, audio transducers, haptic output devices such as piezoelectric devices for producing haptic output (e.g., vibrations), antennas for transmitting wireless signals, communications circuits for transmitting data over wired communications links, etc.).

Input-output devices 14 may also include components for gathering input from a user and from a user's surroundings. Devices 14 may, for example, include temperature sensors, pressure sensors, force sensors, gas sensors (e.g., carbon monoxide sensors), particulate sensors, moisture sensors, light sensors, magnetic sensors, capacitive sensors (e.g., sensors for touch or proximity measurements), gesture sensors, image sensors, proximity sensors, touch sensors, button sensors (e.g., switches coupled to movable button members or button regions), sensors that gather other types of input and/or hybrid sensors that include sensor functionality from any two or more of these sensors. Input and output can also be provided using accessories (e.g., other items 10 such as pointing devices, etc.). Wireless communications can be supported by wireless transceiver circuitry and antennas in devices 14. If desired, multiple components 16 can be used together. For example, multiple captive sensor devices may be used together in an array in item 10 to form a two-dimensional touch sensor. As another example, multiple light-emitting diodes or lasers may be used to form a pixel array that is configured to display images for a user.

Item 10 can include strands of material. The strands of material may be embedded in polymer or other binder, may be free of binder, may be intertwined to form fabric, or may be otherwise incorporated into item 10. Strands can be formed from polymer, metal, glass, and/or other materials. In some configurations, strands of material in item 10 include multiple types of material (e.g., embedded conductive paths formed from metal wires, polymer, etc.). Wires can be insulating (e.g., when formed of plastic, glass, or other dielectric) and/or may be conductive (e.g., when a polymer strand is coated with a metal layer and/or one or more metal lines is coated with polymer to form a strand).

Figure 2:
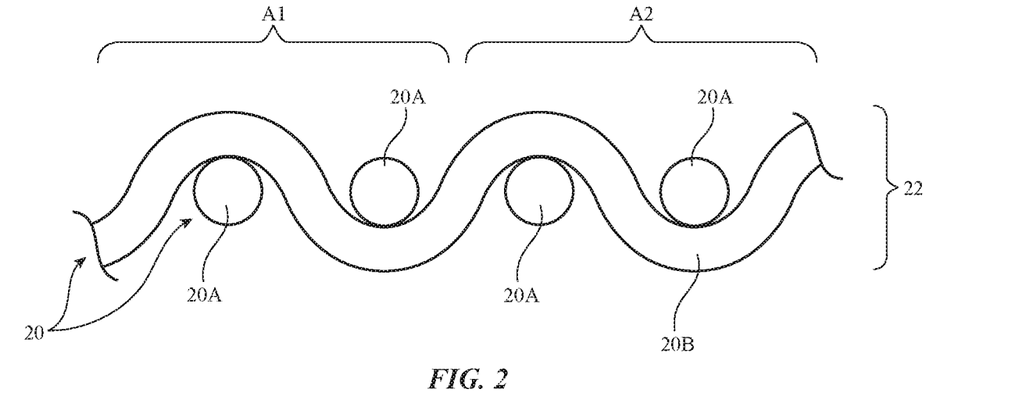
FIG. 2 is side view of illustrative fabric in accordance with an embodiment.

Illustrative strands of material for item 10 are shown in FIG. 2. In the example of FIG. 2, strands 20 have been intertwined together to form fabric 22. Strands 20 may include warp strands 20A and weft strands 20B in woven fabric (as an example). In the illustrative configuration of FIG. 2, fabric 22 has a single layer of woven strands 20. Multi-layer fabric constructions may be used for fabric 22 if desired. Fabric 22 may be woven fabric, knit fabric, or may include strands of material that have been intertwined using other intertwining techniques (e.g., braiding). Sewn strands, felted strands, and other strands may be incorporated into item 10, if desired.

Binder (e.g., polymer) may be incorporated into fabric 22 to bind strands 20 together. Circuitry may be embedded into strands 20 to form a sensor array, a display, and/or other input-output devices 14. The types of circuit components and materials that are incorporated into fabric 22 may vary across fabric 22. As a result, different areas of fabric 22 may have different properties. As an example, the properties of area A1 of fabric 22 may differ from the properties of area A2 of fabric 22.

Properties of fabric 22 that may be varied throughout fabric 22 (e.g., properties that may differ between areas A1 and A2 in the example of FIG. 2) include optical properties such as color, light reflectance, light absorption, and/or light transmission, mechanical properties such as stiffness, moisture repellency, abrasion resistance, etc., electrical properties such as electrical conductivity, input-output capabilities (e.g., display capabilities, acoustic input and output capabilities, sensing capabilities), etc. Properties such as these may be varied by adjusting the amount of binder or other material that is incorporated into fabric 22, by adjusting the fabric construction (strands per inch, number of fabric layers, weave pattern, knit pattern, etc.) used in forming fabric 22, and/or adjusting the composition of individual strands 20. Strands 20 may have properties that vary along their lengths (e.g., stiffness, diameter, optical properties, etc.).

Figure 3:
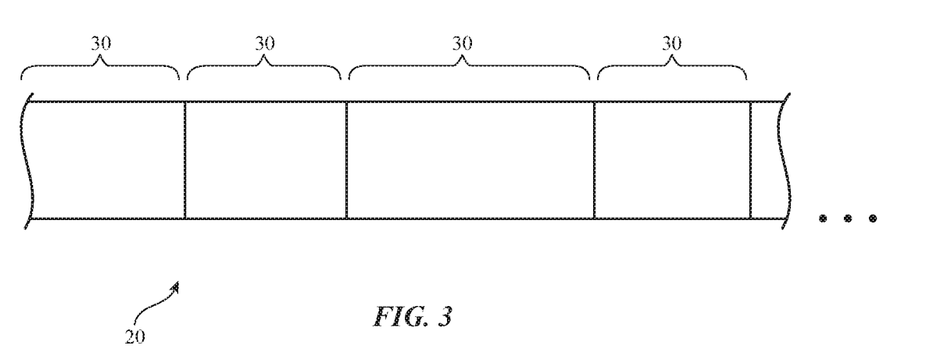
FIG. 3 is a side view of an illustrative strand of material formed from a series of joined strand segments in accordance with an embodiment.

Strands 20 may have segments with different properties, as illustrated by segments 30 of strand 20 in FIG. 3. For example, a strand may be formed by assembling segments with different embedded circuits and/or other selected properties together. Strand segments may, as an example, be joined using strand segment joining techniques such as thermal joining techniques in which thermoplastic polymer strand material is thermally softened (e.g., melted to a molten state) and then resolidified to form a solid polymer strand segment joint. Conductive lines in strand segments can be joined using ball bonding techniques (e.g., ultrasonic ball bonding techniques, heat-based ball bonding techniques, electric spark-welding-type ball bonding techniques), and/or other suitable electrical connection formation techniques. Computer-controlled strand assembling equipment can be used to assemble custom sequences of strand segments, thereby producing desired circuit networks. Customized strands 20 can be formed by removing desired segments 30 from source strands that are uniform (or nearly uniform) along their lengths and by joining these segments 30 together as shown in FIG. 3. With an illustrative configuration, a multi-segment strand may include a series of strand segments containing interconnect lines with interspersed electrical components such as light-emitting diodes, sensors, haptic output devices, control circuits, etc. Each component may be embedded entirely within polymer strand material, thereby insulating the component from its surrounding environment. If desired, embedded electrical components can be formed from bare semiconductor dies (e.g., silicon dies, compound semiconductor dies, or other semiconductor dies without enclosing plastic packages) to conserve space and thereby allow strand diameters to be reduced.

Figure 4:
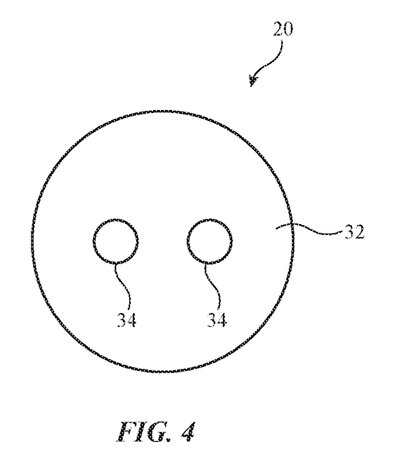
FIG. 4 is a cross-sectional end view of an illustrative strand of material with embedded conductive lines in accordance with an embodiment.
Figure 5:
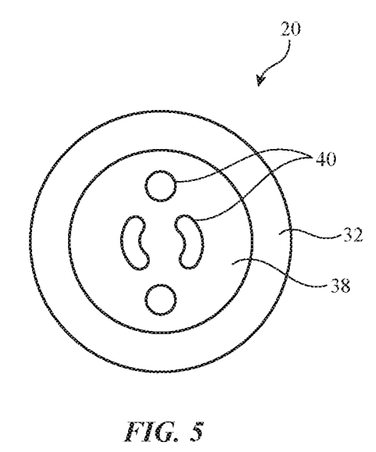
FIG. 5 is a cross-sectional end view of an illustrative strand of material such as a strand of tubing in accordance with an embodiment.
Figure 6:
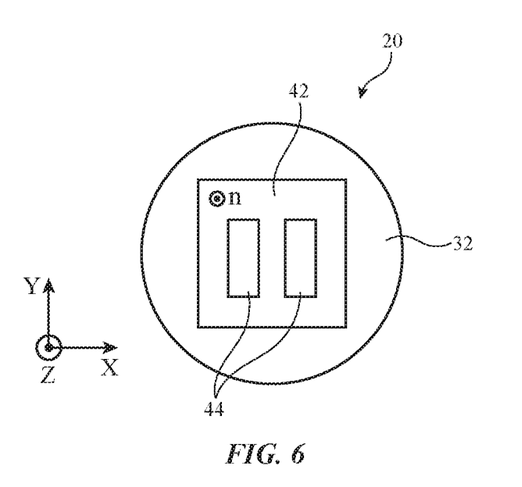
FIG. 6 is a cross-sectional end view of an illustrative strand of material with an electrical component in accordance with an embodiment.
Figure 7:
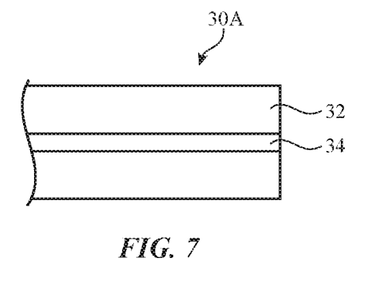
FIG. 7 is a cross-sectional side view of an illustrative strand of material with an embedded conductive line in accordance with an embodiment.

Illustrative source strands 20 are shown in the cross-sectional end views of strands 30 of FIGS. 4, 5, and 6.

In the example of FIG. 4, strand 20 includes conductive lines 34 embedded in strand material 32 (e.g., polymer, glass, or other dielectric). Material 32 may be a thermoplastic polymer resin or other suitable dielectric (polymer, glass, etc.). Conductive lines 34 may be formed from metal or other suitable conductive material. There may be one or more lines 34 running along the length of strand 20 (e.g., one or more lines 34, at least two lines 34, at least three lines 34, at least four lines 34, at least 5 lines 34, at least 10 lines 34, fewer than 20 lines 34, fewer than 8 lines 34, etc.).

FIG. 5 shows how central portion 38 of strand 20 may be different than the outer portion of strand 20. As an example, the outer portion of strand 20 may be formed from material 32 (e.g., polymer, glass, or other dielectric, and/or other suitable material(s)). Inner portion 38 may be hollow, may be an opening filled with fluid (e.g., water or other liquids), solid material (e.g., polymer), and/or other material. Optional particles 40 may be formed in portion 38 (e.g., portion 38 may contain electrophoretic ink particles, photoluminescent particles, particles or other material for sensing the presence of gases or other materials, and/or other suitable optional structures).

As shown in FIG. 6, electrical components such as component 42 may be embedded in material 32 of strand 20. Material 32 may, for example, surround and isolate component 42 from the surrounding environment. Electrical contacts 44 (sometimes referred to as contact pads or terminals) may be formed on component 42. There may be any suitable number of contacts 44 on component 42 (e.g., at least 1 at least 2, at least 5, at least 20, fewer than 30, fewer than 15, etc.). Contacts 44 can be formed on one side of component 42, on opposing sides of component 42, on side portions of component 42, etc.

Component 42 may be an input-output circuit component (e.g., a sensor, a haptic output device, control circuitry, and/or other suitable components (see, e.g., electrical components 16 of FIG. 1). Components 42 may, if desired, be semiconductor dies. The dies may be oriented with their lateral dimensions extending along the length of strand 20 or, as shown in FIG. 6, may be oriented so that the surface normal n of the die runs parallel to the Z axis of FIG. 6 (e.g., surface normal n may extend along the length of strand 20 so that the plane of the die lies perpendicular to the longitudinal axis of strand 20). In this illustrative arrangement, component 42 (e.g., a semiconductor die for a light-emitting diode(s), laser(s), integrated circuit, sensor, etc.) may have lateral dimensions (in the X-Y plane of FIG. 6) of at least 1 micron, at least 5 microns, at least 15 microns, at least 50 microns, less than 1000 microns, less than 500 microns, less than 200 microns, less than 100 microns, less than 50 microns, less than 25 microns, less than 15 microns, or other suitable lateral dimension). As an illustrative example, component 42 may be a light-emitting diode die having lateral dimensions of 8 microns and a thickness of less than 4 microns, at least 0.1 microns, or other suitable thickness.

FIGS. 7, 8, 9, and 10 are cross-sectional side views of illustrative strands showing how a strand may be formed by joining segments in a desired sequence using computer-controlled segment joining equipment. In the example of FIGS. 7, 8, 9 and 10, first segment 30A, second segment 30B, and third segment 30C are being assembled.

Figure 8:
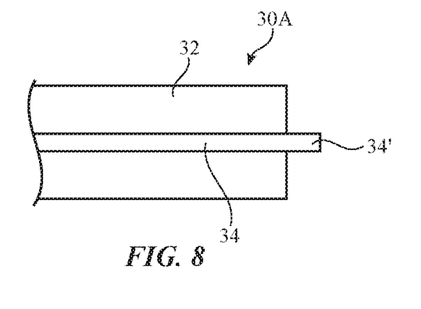
FIG. 8 is a cross-sectional side view of the illustrative strand of material of FIG. 8 after treatment to expose an end portion of the conductive line in accordance with an embodiment.

Initially, a strand (e.g., first strand segment 30A of FIG. 7) may have a conductive line such as line 34 that is embedded in dielectric strand material 32 (e.g., polymer strand material) without any portion of line 34 exposed. As shown in FIG. 8, a portion of the tip of material 32 can be removed (e.g., by application of heat, application of chemicals, or other material removal techniques). This exposes tip portion 34' of conductive path 34. First segment 30A and third segment 30C can be prepared in this way.

Figure 9:
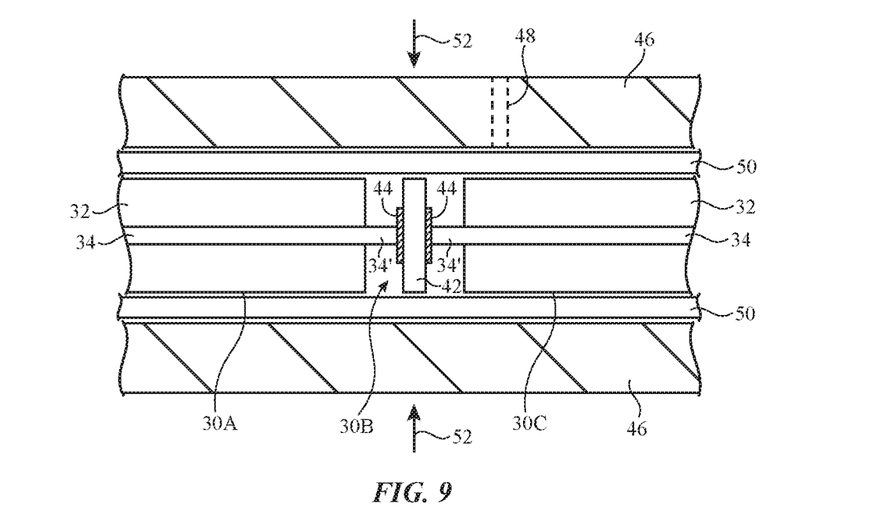
FIG. 9 is a cross-sectional side view of an illustrative pair of strand segments such as the strands segment of FIG. 8 being coupled to a component associated with an additional segment in accordance with an embodiment.

Assembly equipment for joining segments is shown in FIG. 9. As shown in FIG. 9, strand segments 30A and 30C may be inserted into opposing ends of a guide structure such as tube 50. Tube 50 may be formed from a non-stick material that is able to withstand high temperatures (e.g., polytetrafluoroethylene). Outer support structures 46 may be used to apply inward pressure (e.g., in directions 52) during segment joining operations. Structures 46 may be formed from a tube, from upper and lower dies (e.g., a two-part or other multi-part compression sleeve), and/or other suitable support structures (e.g., clamping structures, vacuum compression structures, pneumatic compression structures, etc.). Optional openings such as opening 48 may be provided to allow compressed gas and/or solvent to be introduced into the interior of tube 50 following segment joining operations (e.g. to use the gas and/or solvent to help release strand 20 from the interior of tube 50).

Tube 50 may be used to guide desired segments 30 together during segment joining operations. With one illustrative configuration, component 42 is placed within tube 50 between segment 30A and segment 30C, as segment 30A and 30C are pushed towards each other. Optional heat, ultrasonic vibrations, electricity, etc. may applied to facilitate bonding between lines 34 and component contacts 44. This causes conductive lines 34 to make electrical connections with respective contacts 44 on component 42 (e.g., via ball bonding). Heat may then be applied (e.g., by heating support structures 46 in the vicinity of component 42), which may cause portions of material 32 to melt and flow over component 42. If desired, polymer that is liquid at room temperature or other coating materials can be used to coat component 42. The use of heat to melt portions of material 32 to supply coating material for component 42 is illustrative. While conductive lines 34 are pushed into contacts 44, electrical joints (e.g., mechanical connections and electrical short circuit connections) can be formed between lines 34 and contacts 44. Any suitable electrical connection formation process may be used (e.g., ball bonding, solder, welds, conductive adhesive, etc.).

Figure 10:
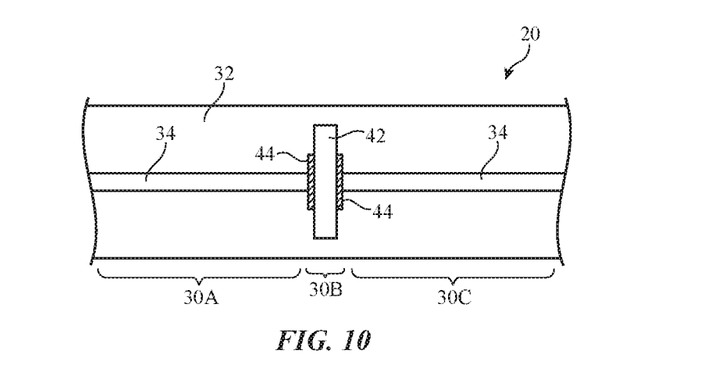
FIG. 10 is a cross-sectional side view of an illustrative strand formed using the process of FIG. 9 in accordance with an embodiment.

Following formation of segment 30B (e.g., by reflowing portions of material 32 over component 42), strand 20 may be removed from guide tube 50 and may have the appearance shown in FIG. 10. If desired, coating material 32 may be applied over component 44 after left segment 30A is pushed to the right while right segment 30C is pushed to the left so that conductive line 34 electrically joins the segments together. In the example of FIG. 9, a central segment 30B is being formed from component 42 and is being joined between segments 30A and 30C that contain conductive lines 34. In general, any suitable number of segments 30 can be joined in tube 50 in each joining operation and each segment may contain any desired circuitry (one or more conductive lines, discrete components such as resistors, inductors, and capacitors, sensors, components formed from semiconductor dies such as light-emitting diodes, lasers, integrated circuits, haptic output devices, other circuits for gathering input and providing output, supercapacitors and other energy storage devices, and/or other suitable circuits. The example of FIGS. 7, 8, 9, and 10 is illustrative.

Figure 11:
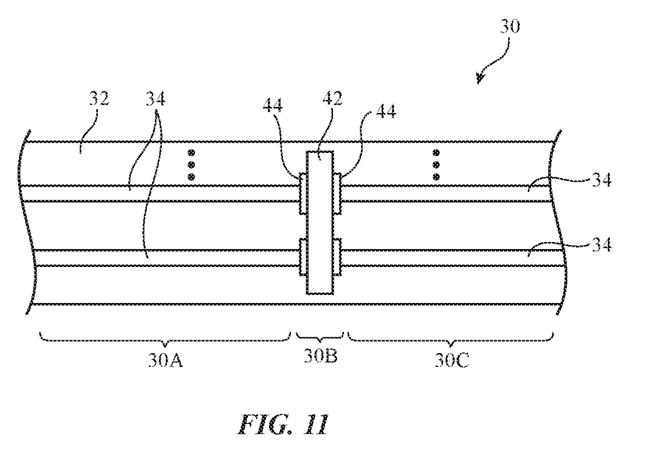
FIG. 11 is a cross-sectional side view of an illustrative strand of material having multiple conductive paths joined to contacts on an electrical component in accordance with an embodiment.

FIG. 11 is a cross-sectional side view of an illustrative strand 20 formed from three segments (30A, 30B, and 30C) showing how strand 20 may have two or more parallel embedded conductive lines 34 (e.g., one or more data lines, positive signal lines, ground lines, power lines, etc.). Conductive lines 34 may be coupled to contacts 44 on opposing sides of component 42 and/or may otherwise be coupled to contacts 44.

Figure 12:
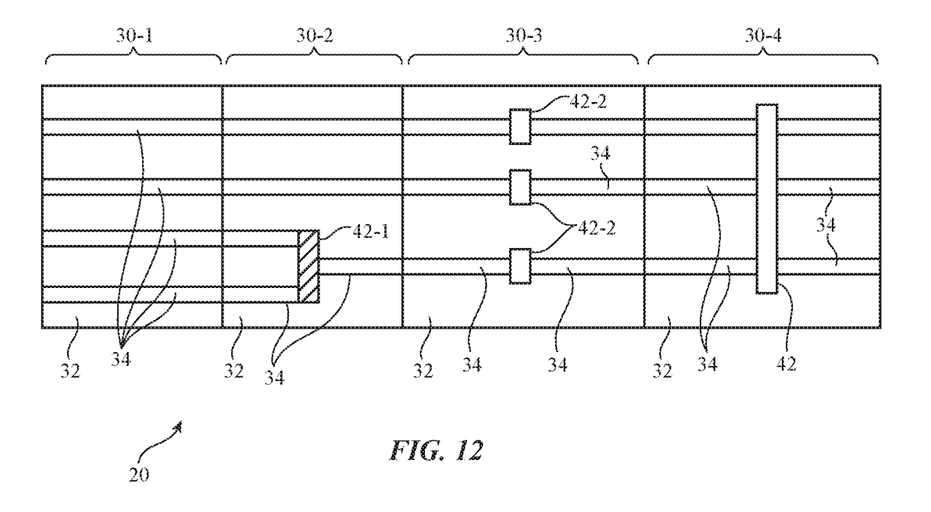
FIG. 12 is a cross-sectional side view of an illustrative strand having multiple segments with different respective circuits in accordance with an embodiment.

FIG. 12 shows another illustrative strand with multiple parallel embedded conductive lines 34. In the example of FIG. 12, strand 20 includes first segment 30-1 (e.g., a segment with four conductive lines 34), second segment 30-2 (e.g., a segment with a metal member or other component 42-1 that forms a short circuit between two left-hand lines 34 and thereby couples these two left-hand lines 34 into a single right-hand line 34), third segment 30-3 (e.g., a segment containing three parallel components 42 such as integrated circuits, light-emitting diodes or lasers, sensors, haptic output devices, etc.), and fourth segment 30-4 that contains a component 42 that is coupled between three respective left-hand lines 34 and three respective right-hand lines 34. In a given strand 20 in fabric 22, there may be any suitable number of segments 30 and each of these segments may have a potentially different respective embedded circuit. The circuits associated with segments 30 may contain interconnects (e.g., conductive lines 34 including conductive line structures that serve to bridge and/or divide signal paths formed from parallel conductive lines 34) and/or semiconductor devices or other embedded components 42. In fabric 22, the circuitry of segments 30 in one or more strands 20 may be interconnected. This allows desired circuits (see, e.g., control circuitry 12 and/or input-output devices 14 of FIG. 1) to be formed in fabric 22 and item 10. External control circuitry and/or other circuitry (batteries, etc.) may be coupled to the circuitry that is embedded in strands 20 for controlling the circuitry in strands 20, if desired.

Strands 20 may have circular cross-sectional shapes or other suitable cross-sectional shapes. To help rotationally align segments 30 during segment joining operations, segments 30 (e.g., strands of material with embedded conductive lines, embedded components, and/or other embedded circuits from which segments 30 are cut or otherwise formed), may be provided with rotational alignment structures. The use of rotational alignment structures may help ensure that conductive lines 34 are joined satisfactorily to desired mating lines 34, to ensure that each conductive line 34 is joined to a desired contact pad 44 on a component 42, and to otherwise ensure that the circuitry of adjacent segments 30 is satisfactorily interconnected.

Figure 13:
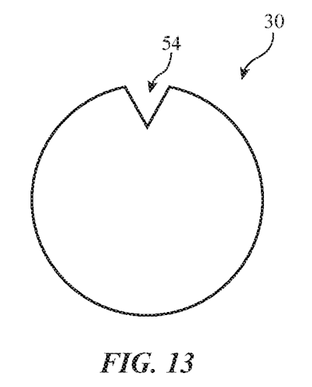
FIGS. 13, 14, and 15 are cross-sectional end views of illustrative strands with rotational alignment features in accordance with embodiments.
Figure 14:
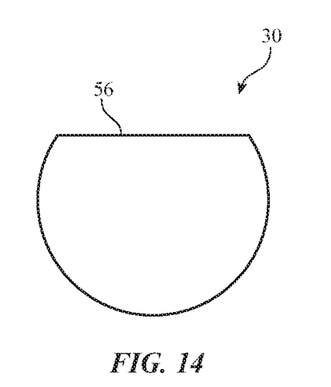
Figure 15:
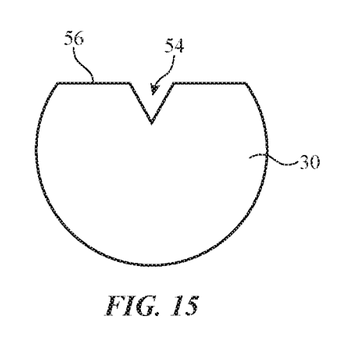
Figure 16:
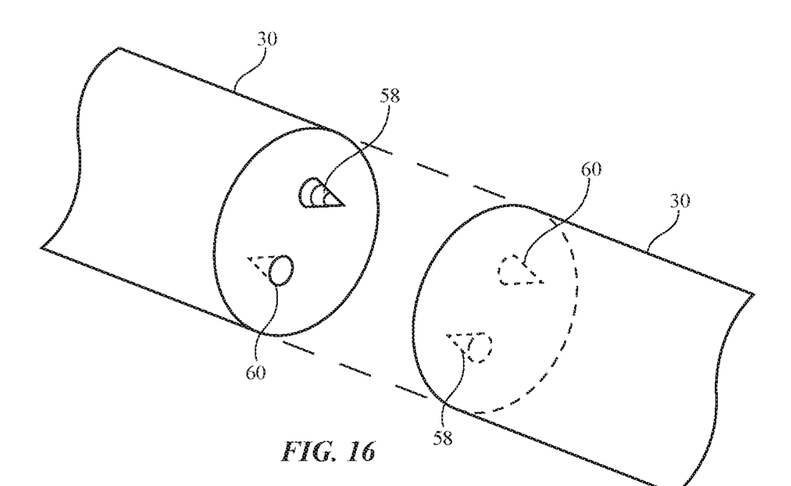
FIG. 16 is a perspective view of a pair of strands having respective protruding and recessed alignment features in accordance with an embodiment.

In the example of FIG. 13, notch 54 in the outer surface of segment 30 forms a rotational alignment feature. In the example of FIG. 14, planar portion 56 of segment 30 forms a rotational alignment feature. FIG. 15 shows how alignment structures for strand segment 30 may be formed using planar surface 56 and notch 54. FIG. 16 is an exploded perspective view of a pair of segments 30 showing how the tips of segments 30 may be provided with structures such as alignment protrusions 58 and mating alignment recesses 60 to facilitate rotational alignment when joining segments 30. Other types of alignment structures may be provided on the side surfaces and/or end surfaces of segments 30 to help ensure that segments 30 that are being joined to each other are rotationally aligned with each other. The examples of FIGS. 13, 14, 15, and 16 are illustrative.

Figure 17:
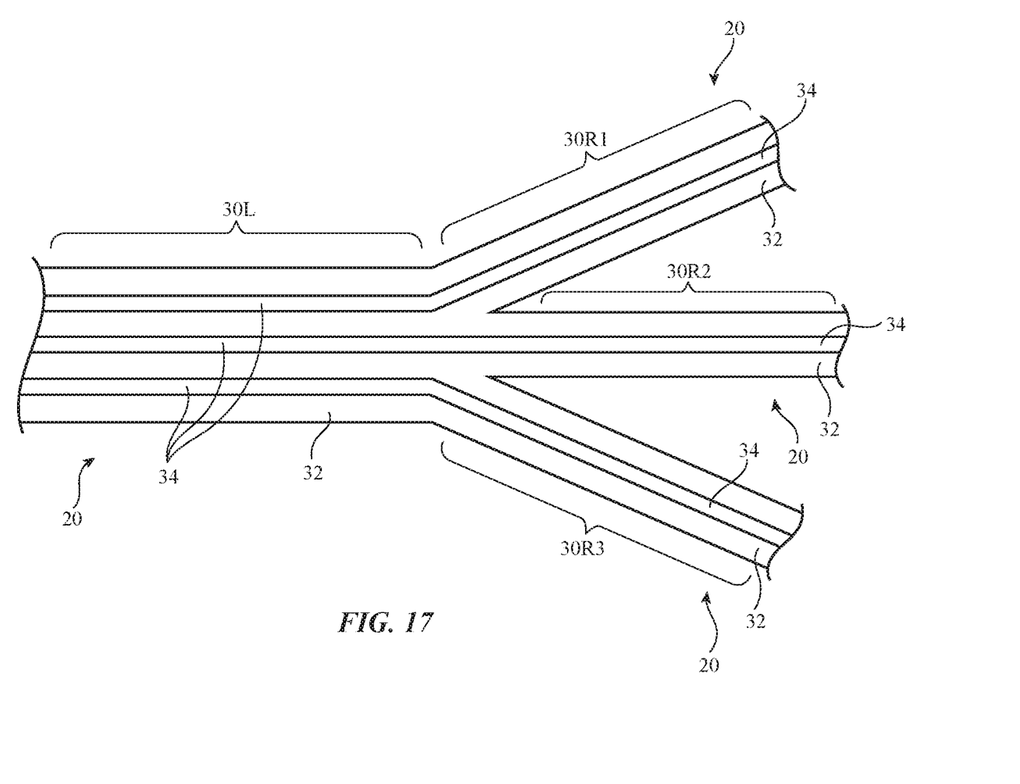
FIG. 17 is a cross-sectional side view of a branching strand in accordance with an embodiment.

If desired, strands 20 may be provided with portions that join a single strand segment to multiple strand segments, thereby dividing and/or joining strands 20. As shown in FIG. 17, for example, a single strand (strand segment) 30L can be joined to three respective strands (strand segments) 30R1, 30R2, and 30R3. In this way, strands 20 can split into sets of multiple respective strands 20 and/or multiple strands 20 can be combined into a single corresponding strand 20. This approach may be used to divide and combine strand segments formed from hollow tubing, strand segments formed from various components 42, strands containing lines 34 that form interconnects, and/or other strands. In the example of FIG. 17, strand 30L contains three parallel conductive lines 34 embedded in insulating material 32 (e.g., polymer) and strands 30R1, 30R2, and 30R3 each contain a corresponding one of three associated conductive lines 34. Signal paths may be joined and divided in this way to facilitate signal routing, to form a wiring harness (e.g., by dividing signal paths into individual strands for soldering to respective contact pads, etc.), or to form other structures with joined and/or divided signal paths.

In some segment joining operations, supplemental structures such as support rings may be formed around the seam between joined segments. For example, a polymer reinforcement collar may be attached around a seam using adhesive, melting and reflowing of thermoplastic material, and/or other attachment techniques. Joints (splices) between segments may be formed using spliced surfaces that run perpendicular to the longitudinal axes of the strands or may be formed using spliced surfaces that are angled (e.g., at 30°) relative to the longitudinal axes of the strands.

Figure 18:
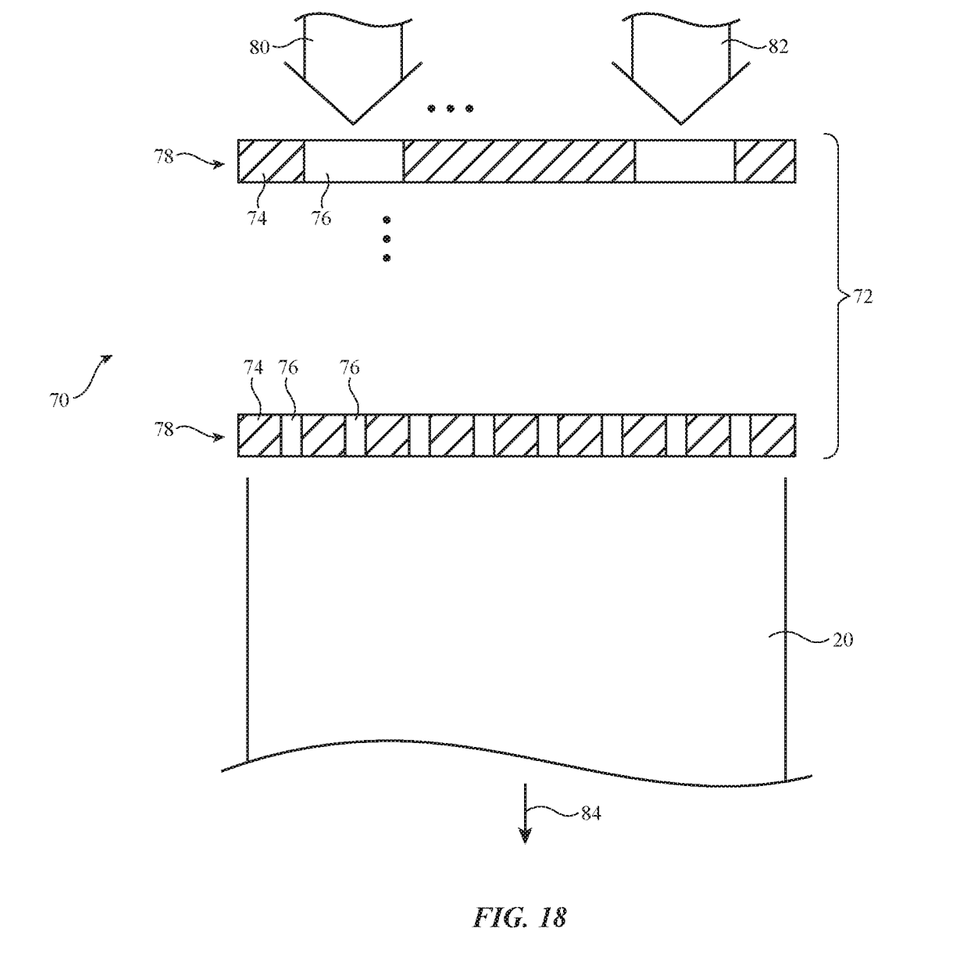
FIG. 18 is a cross-sectional side view of illustrative strand fabrication equipment in accordance with an embodiment.

Strands 20 may, if desired, be formed using techniques such as melt spinning, wet and dry spinning, electro-spinning, and/or thermal drawing. An illustrative melt spinning arrangement that may be used in forming a strand is shown in FIG. 18. As shown in FIG. 18, melt spinning tool 70 may be used to form strand 20 from source materials 80 and 82 (e.g., at least two source materials, at least 3 source materials, at least 5 source materials, at least 10 source materials, fewer than 20 source materials, etc.). Die plate stack 72 includes multiple die plates 78. There may be, for example, at least 10, at least 40, at least 100, at least 200, fewer than 250, fewer than 120, or fewer than 50 die plates 78 in stack 72. Each die plate 78 may be formed from a support structure such as a metal layer 74 with a desired set of openings 76. The patterns of openings 76 in plates 78 of stack 72 can be selected to manipulate incoming materials sources (see, e.g., sources 80 and 82) and thereby form a strand 20 with a desired pattern of the material from sources 80 and 82 as strand 20 is extruded through stack 72 and drawn in direction 84 from tool 70.

The input materials to strand 20 (e.g., the materials of sources 80 and 82) may be insulating materials (e.g., dielectric materials such as polymer, glass, ceramic, etc.), conductive materials (e.g., polymer filled with metal particles or other conductive material, etc.), may be semiconductors, photoluminescent materials, and/or materials with other desired properties for forming embedded circuitry. In some configurations, electrical components 20 can be formed within a strand as it is being formed. In other configurations, electrical components may be joined with other circuits using a tube-based arrangement of the type described in connection with FIG. 9 (as an example).

After forming strands such as strand 20 of FIG. 18 and/or other strands with desired patterns of embedded interconnects, embedded semiconductor dies, other electrical components 16, and/or other embedded circuits, optical components such as waveguides, etc., these strands 20 (which may be axially uniform) can be divided to form respective segments 30 and, using computer-controlled strand segment assembly equipment (see, e.g., the illustrative equipment of FIG. 9) can be joined together to form an assembled strand 20 with a desired pattern of interconnected strand segments 30 (e.g., a strand that is not uniform along its length).

Figure 19:
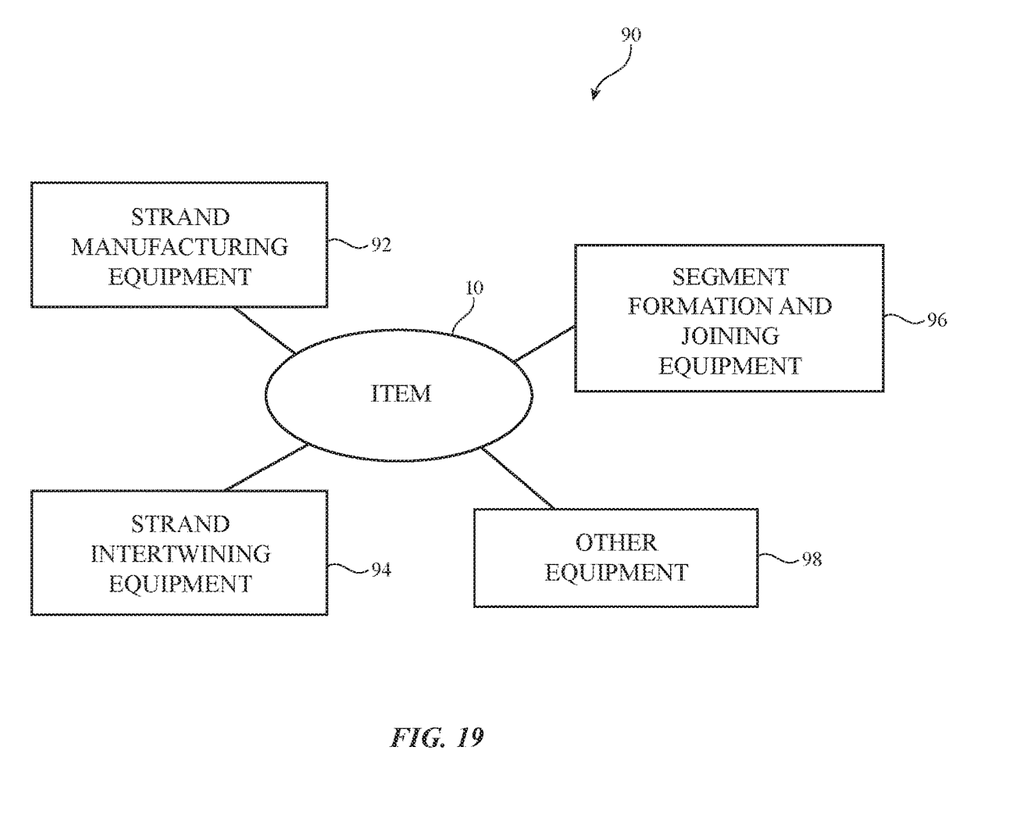
FIG. 19 is a diagram showing illustrative equipment of the type that may be used in forming items in accordance with an embodiment.

Illustrative equipment 90 for forming items 10 of system 8 is shown in FIG. 19. As shown in FIG. 19, equipment 90 may include strand formation tools such as equipment 92 for forming strands of material with embedded circuitry that are to be used as source strands for segments 30. Equipment 92 may form strands 20 or parts of strands 20 using melt spinning, wet and dry spinning, electro-spinning, thermal drawing, etc. Circuitry can be embedded within one or more strand materials 32, so that strands 20 are uniform or nearly uniform along their lengths. For example, a strand 20 may be formed that contains a continuous set of embedded components each of the same type of component (e.g., a series of light-emitting diodes or a series of integrated circuits). These components may, for example, be provided at fixed distances along the length of a strand. The linear density of components 42 along the length of strand 20 may be, for example, at least 1/mm, at least 10/mm, at least 100/mm, at least 1000/mm, less than 500/mm, less than at 150/mm, less than 25/mm, etc. In other configurations, axially uniform sensor electrodes and/or other axially uniform structures may be formed in a source strand.

It may be relatively efficient to form source strands with large numbers of embedded components using a process that produces strands that are uniform along their lengths. Equipment 92 may form any suitable number of source strands (e.g., at least 5, at least 10, at least 100, at least 250, fewer than 125, fewer than 50, etc.). Each of the source strands (e.g., each of the axially uniform or semi-uniform strands produced by equipment 92) may be available to other equipment such as segment formation and joining equipment 96 for use in assembling strands with desired patterns of embedded circuits. With one illustrative arrangement, a rotating turret may be used to present each of numerous different source strands to a computer-controlled strand segment assembling head, which selects segments from among each of the available source strands.

Equipment 96 may, for example, remove segments 30 of desired lengths from desired source strands and may then join these selected segments 30 together in a desired pattern to form an assembled strand 20 with a desired network of embedded circuitry. Equipment 96 may serve as a computer-controlled pick-and-place tool that picks desired strand segments from a set of strand sources and that places these strand segments end-to-end in a desired combined strand 20. Strands 20 with customized sets of strand segments and, if desired, axially uniform strands may be used in forming item 10.

After forming uniform strands and strands with desired customized patterns of embedded circuits, for example, strand intertwining equipment 94 (e.g., equipment for weaving, knitting, braiding, sewing, etc.) can be used for forming fabric 22 from these strands. Equipment 98 may be used to form item(s) 10 using fabric 22 and structures formed from other materials.

The foregoing is merely illustrative and various modifications can be made to the described embodiments. The foregoing embodiments may be implemented individually or in any combination.

What is claimed is:

1. A fabric-based item, comprising:
    fabric formed from intertwined strands of material including a strand of material with multiple joined strand segments, wherein the joined strand segments include electrically interconnected electrical devices embedded within polymer strand material, wherein the polymer strand material has a longitudinal axis, wherein the joined strand segments comprise first strand segments and second strand segments, wherein each of the first strand segments and the second strand segments comprises at least two parallel conductive lines embedded in the polymer strand material, and wherein each of the conductive lines has a longitudinal axis that is parallel to the longitudinal axis of the polymer strand material; and
    control circuitry configured to control the electrically interconnected electrical components.

2. The fabric-based item defined in claim 1 wherein the first strand segments have semiconductor dies that are joined by the second strand segments, and wherein the second strand segments have embedded conductive lines that are electrically coupled to contacts on the semiconductor dies.

3. The fabric-based item defined in claim 2 wherein each of the semiconductor dies has opposing first and second sides, a first contact on the first side that is coupled to a first of the embedded conductive lines, and a second contact on the second side that is coupled to a second of the embedded conductive lines.

4. The fabric-based item defined in claim 3 wherein the first and second conductive lines comprise respective first and second metal lines that are bonded respectively to the first and second contacts.

5. The fabric-based item defined in claim 2 wherein the at least two parallel conductive lines embedded in the polymer strand material run along the strand of material having the joined strand segments.

6. The fabric-based item defined in claim 5 wherein the semiconductor dies include light-emitting devices.

7. The fabric-based item defined in claim 5 wherein the semiconductor dies include integrated circuit dies.

8. The fabric-based item defined in claim 1 wherein each of the first strand segments contains an embedded conductive line and the second strand segments are electrically coupled to the first strand segments.

9. The fabric-based item defined in claim 8 wherein the second strand segments each include a semiconductor die with a light-emitting device.

10. The fabric-based item defined in claim 8 wherein the second strand segments each include a sensor.

11. The fabric-based item defined in claim 8 wherein the second strand segments each include a haptic output device.

12. The fabric-based item defined in claim 1 wherein the control circuitry comprises an integrated circuit embedded in the polymer strand material of the joined strand segments.

13. A fabric-based item, comprising:
    fabric comprising:
        intertwined polymer strands that each has first strand segments joined to second strand segments, wherein the first and second strand segments each have rotational alignment structures including protrusions and recesses configured to rotationally align the first strand segments and the second strand segments; and
        electrical components embedded in the polymer strands, wherein the electrical components have contact pads that are electrically connected to conductive lines embedded in the polymer strands; and
    control circuitry configured to control the electrical components.

14. The fabric-based item defined in claim 13 wherein the electrical components comprise integrated circuit dies and wherein the conductive lines are bonded to the contact pads.

15. The fabric-based item defined in claim 14 wherein the first strand segments each include a respective one of the electrical components.

16. The fabric-based item defined in claim 15 wherein the second strand segments each include a respective one of the conductive lines.

17. A strand of dielectric material formed from joined segments, the strand comprising:

first strand segments that each include first and second parallel metal lines embedded in first polymer strand material, wherein the first polymer strand material has a longitudinal axis, and wherein the first and second metal lines each have a longitudinal axis that is parallel to the longitudinal axis of the first polymer strand material; and second strand segments that each include a semiconductor die embedded in second polymer strand material.

18. The strand of dielectric material defined in claim 17 wherein the first strand segments each include a third parallel metal line that is embedded in the first polymer strand material and runs parallel to the first and second parallel metal lines of that strand segment.

19. The strand of dielectric material defined in claim 18 wherein the first and second strand segments have circular cross-sectional shapes with rotational alignment structures.

* * * * *